United States Patent
Bhansali et al.

(10) Patent No.: US 6,265,300 B1
(45) Date of Patent: Jul. 24, 2001

(54) WIRE BONDING SURFACE AND BONDING METHOD

(75) Inventors: Ameet S. Bhansali, Fremont, CA (US); Gay M. Samuelson, Tempe, AZ (US); Venkatesan Murali, San Jose, CA (US); Michael J. Gasparek, Tempe, AZ (US); Shou H. Chen, Mesa, AZ (US); Nicholas P. Mencinger, Tempe, AZ (US); Ching C. Lee, Penang (MY); Kevin Jeng, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/154,268

(22) Filed: Nov. 18, 1993

Related U.S. Application Data

(62) Division of application No. 08/040,521, filed on Mar. 31, 1993, now Pat. No. 5,567,981.

(51) Int. Cl.⁷ ................................................... H01L 21/44
(52) U.S. Cl. ......................... 438/612; 438/614; 438/652; 438/685; 438/686
(58) Field of Search .................................... 437/209, 211, 437/212, 214, 215, 217, 182, 183, 192, 193; 257/737, 763, 764, 765, 766, 771, 784; 438/612, 613, 614, 652, 653, 654, 655, 656, 695, 686, 687

(56) References Cited

U.S. PATENT DOCUMENTS

| | | | |
|---|---|---|---|
| 4,017,886 | 4/1977 | Tomono et al. | 257/643 |
| 4,743,568 | * 5/1988 | Wood | 437/183 |
| 4,842,662 | * 6/1989 | Jacobi | 437/209 |
| 4,887,146 | 12/1989 | Hinode | 257/753 |
| 4,933,305 | * 6/1990 | Kikkawa | 437/211 |
| 4,990,993 | 2/1991 | Tsurumaru | 257/643 |
| 5,060,051 | * 10/1991 | Usuda | 257/784 |
| 5,146,312 | 9/1992 | Lim | 257/643 |
| 5,172,212 | * 12/1992 | Baba | 257/784 |
| 5,235,212 | 8/1993 | Shimizu et al. | |
| 5,256,597 | * 10/1993 | Gambino | 437/192 |
| 5,260,604 | 11/1993 | Harada et al. | 257/741 |
| 5,288,007 | * 2/1994 | Interrante et al. | 228/119 |

FOREIGN PATENT DOCUMENTS 0230131   1/1990   (JP) .

* cited by examiner

Primary Examiner—Kevin M. Picardat
(74) Attorney, Agent, or Firm—Blakely, Sokoloff, Taylor & Zafman LLP

(57) ABSTRACT

A bonding pad structure for use with compliant dielectric materials and a method for wire bonding is described in which a rigid layer is formed between the bonding pad and the compliant dielectric layer. The rigid layer increases the stiffness of the bonding structure such that an effective bond may be achieved by conventional ultrasonic and thermosonic bonding methods.

23 Claims, 3 Drawing Sheets

WIRE BONDING SURFACE AND BONDING METHOD

This is a divisional of application Ser. No. 08/040,521, filed Mar. 31, 1993, now U.S. Pat. No. 5,567,981.

BACKGROUND OF THE INVENTION

1. Field of the Invention

The present invention relates to the field of computer chip manufacturing. In particular, the invention relates to the design of an improved wire bonding surface and method for wire bonding for use with semiconductor devices using compliant dielectric materials.

2. Prior Art

Conventional Semiconductor devices are formed by the selective deposition of numerous materials including silicon dioxide ($SiO_2$) dielectric layers and conductive layers upon silicon wafers. The uppermost conductive layers are typically made of Aluminum. The silicon wafers are then sawed to form individual computer chips. The top of each chip typically includes a number of exposed metal regions, known as bonding pads. The connection to packaging and to external devices is accomplished by bonding leads to these bonding pads. These bonding pads are typically formed of aluminum. Conventional bonding methods include the use of thermosonic or ultrasonic bonding methods. Thermosonic bonding is typically used to bond leads having gold wires while ultrasonic is typically used with leads having aluminum wires.

Polyimides are increasingly being studied for forming inter-layer dielectric layers as well as for final passivation of integrated circuits. Though polyimide layers are easy to process and have good planarization, these layers are highly compliant. When conventional bonding pad structures and automated wire bonding processes are used with semiconductor devices having polyimide dielectric layers, serious reliability problems and yield reductions occur. Poor wire pad strength and unacceptable levels of failures occur over a wide range of machine parameters. These failures are primarily due to the compliant nature of the polyimide which does not allow for efficient coupling of the ultrasonic energy at the interface between the lead and the bonding pad surface. The ultrasonic energy is dissipated within the polyimide layers instead of into the bonding process.

What is needed is a bonding pad structure and a method of bonding for forming a high yield, low failure semiconductor chip for use with compliant dielectric materials, and in particular polyimide. This structure and method should use conventional materials for forming bonding pads and should allow for the use of conventional bonding methods and machinery.

SUMMARY OF THE INVENTION

An improved bonding pad structure and a method for wire bonding is disclosed for use with compliant dielectric material. A rigid layer is formed between the compliant dielectric layer and the bonding pad layer. The rigid layer increases the stiffness of the structure overlying the compliant dielectric layers such that mechanical ultrasonic energy is not dissipated into the dielectric. Thus an effective bond may be achieved which will allow for the use of conventional bonding machinery methods and materials. The invention is described with reference to the use of polyimide dielectric layers, however it would be applicable to the use of any compliant dielectric. The bonding pad structure is achieved by depositing a rigid interposed layer over the compliant dielectric layer. Though any compatible rigid material may be used, the interposed layer is preferably titanium. For example, nickel, copper or molybdenum may also be used. The interposed layer may be deposited after vias have been formed so as to simultaneously form plugs and the interposed layer. The interposed layer may also be deposited after the formation of plugs and the planarization of polyimide and plug surfaces. Next, a layer of aluminum is deposited over the wafer surface to form a bonding pad layer. The bonding pad layer and the interposed layer are then etched to form a bonding pad and an interposed pad. Conventional processing steps are then used to form a passivation layer having openings overlying the bonding pads. Leads are then bonded to the exposed surfaces of the bonding pads.

DETAILED DESCRIPTION OF THE INVENTION

An improved wire bonding surface and a method for wire bonding is described. In the following description numerous specific details are set forth such as dimensions, materials, layers, thicknesses, etc., in order to provide a thorough understanding of the present invention. However, it will be obvious to one skilled in the art that the invention may be practical without these specific details. In other instances well-known processing techniques, materials, circuits, etc. have not been shown in detail in order to avoid unnecessarily obscuring the present invention.

Figure 1:
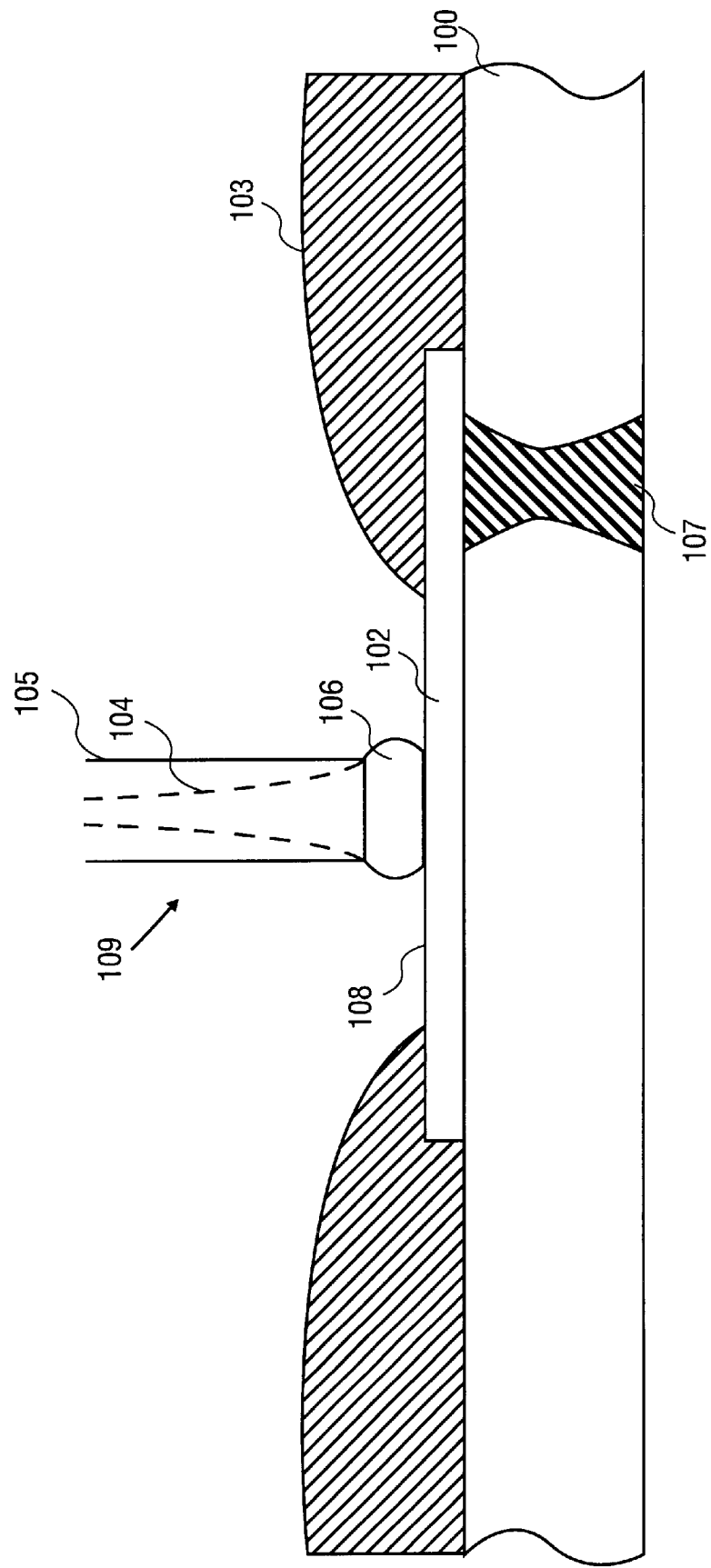
FIG. 1 shows a cross section view of a prior art bonding pad surface and bonded lead.

FIG. 1 illustrates a cross section of a portion of a prior art semiconductor device having a dielectric layer 100 into which vias have been etched and plug 107 formed. A bonding layer of aluminum is then deposited, masked and etched so as to form a bonding pad 102. A layer of passivation material is then deposited masked and etched form passivation layer 103. The etch step exposes a portion of the bonding pad 102. A lead is then attached to the exposed portion of the bonding pad and bonded to the pad by applying ultrasonic energy to the lead. The lead 109 is composed of wire 104 encased in a capillary housing 105 and wire ball 106. The wire is usually aluminum or gold. The application of ultrasonic energy bonds the wire ball 106 to bonding pad 102. This structure and process gives a good bond when silicon dioxide is used to form dielectric layer 100, however, this prior art structure and process gives poor bonding when polyimide is used as a dielectric. This poor bonding is primarily due to the compliant nature of polyimides.

Figure 2:
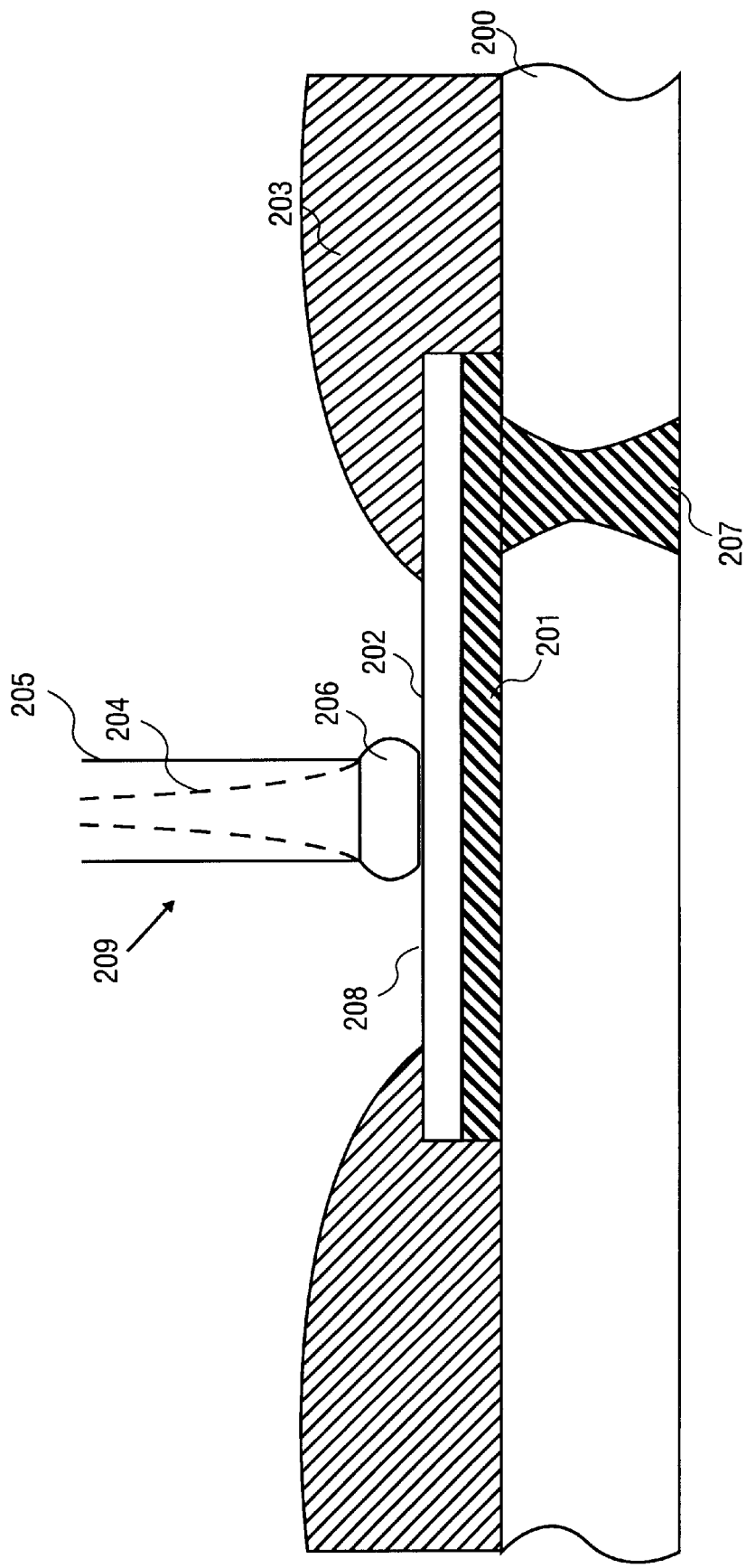
FIG. 2 shows a cross section view of a currently preferred embodiment of the improved bonding pad surface and bonded lead.

FIG. 2 illustrates the structure of a currently preferred embodiment of the present invention. Polyimide layer 200 containing plug 207 is shown. Interposed pad 201 is formed over the polyimide layer in order to form a "stiff stack". This "stiff stack" gives rigidity to the structure which is required for effective bonding. In the preferred embodiment of the present invention the interposed pad is formed of titanium having a thickness of approximately 0.5 $\mu$m. Directly overlying the interposed pad 201 is bonding pad 202. This bonding pad is preferably made of aluminum and has thickness of approximately 3 μm. A passivation layer 203 overlies portions of the bonding pad 202 and polyimide layer 200. Openings in passivation layer 203 form exposed bonding pad surface 208. Lead 209, composed of wire 204 encased in capillary housing 205 and wire ball 206 is shown attached to exposed bonding pad surface 208. In the preferred embodiment of the present invention lead 209 is attached to the exposed bonding pad surface using known prior art bonding methods involving the application of ultrasonic energy to the lead 209. The additional rigidity given by interposed layer 201 keeps the ultrasonic energy from being dissipated into the polyimide. Thus, the effective bonding of lead 209 to bonding pad 202 may be obtained.

Figure 3:
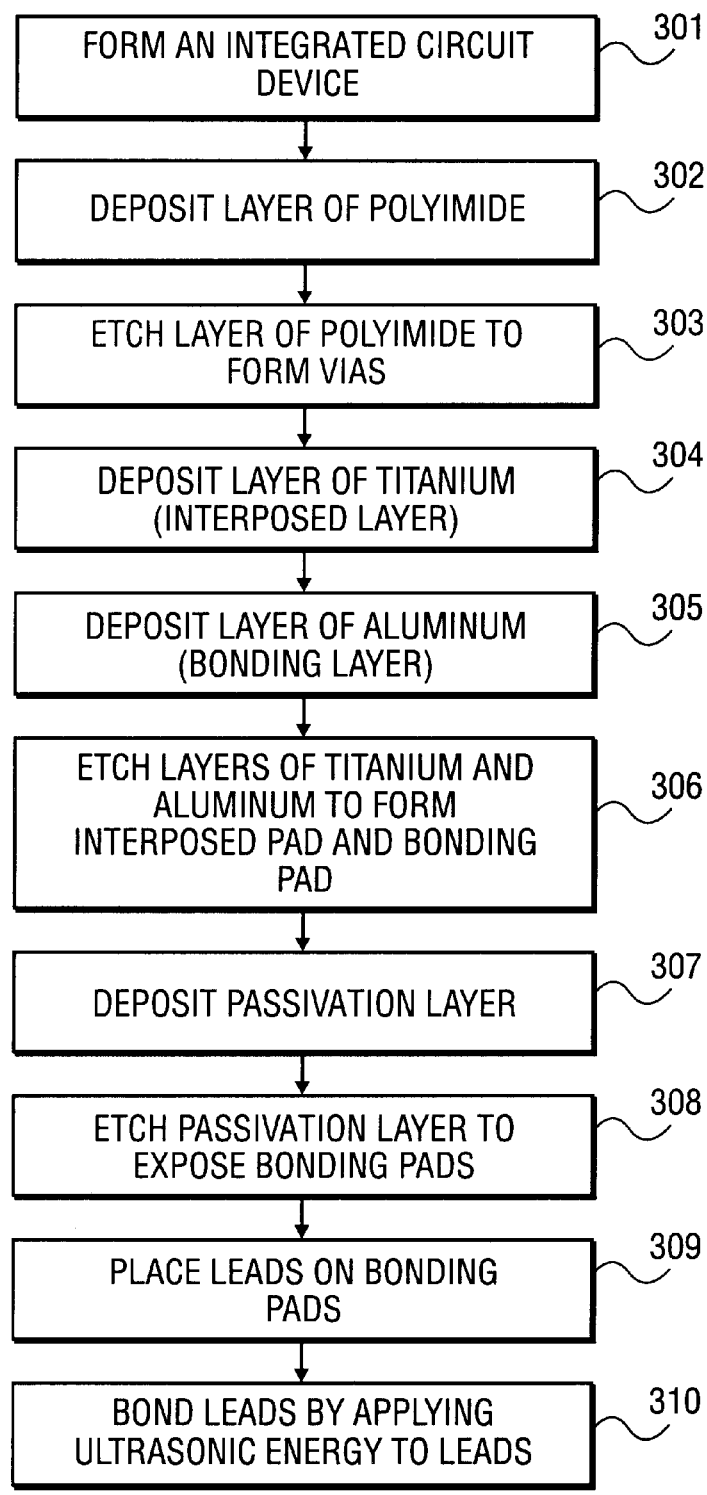
FIG. 3 shows the steps of a currently preferred method for forming an improved bonding pad surface and for wiring bonding.

FIG. 3 illustrates a method for forming an integrated circuit device having a polyimide dielectric layer and bonded leads. First, as illustrated by step 301 an integrated circuit device is formed by methods well known to those with skill in the art. This is typically done by forming device regions in a silicon wafer and depositing a number of overlying layers of conductive and dielectric material so as to form complete semiconductor device. Layers are typically connected by the use of plugs formed in the dielectric layers. These plugs are typically formed by forming openings or vias in the dielectric layer, depositing a layer of refractory metal, and etching and/or polishing the surface to obtain plugs and a uniform dielectric surface. Because of the ease of processing polyimide layers and good planarization, it is desirable to use polyimide as a dielectric material in the formation of the integrated circuit device.

A top layer of dielectric is generally deposited over the top device layer of the integrated circuit device. Block 302 illustrates the deposition of a top dielectric layer over the semiconductor device. In the preferred embodiment of the present invention this top dielectric layer is polyimide. This layer is typically deposited over a layer of conductive material such as aluminum. In the preferred embodiment of the present invention a commercially available polyimide ULTRADEL™ 4212 is spun on the wafer. The wafers are then cured in a conventional convection oven. This top polyimide layer preferably has a thickness of 10 μm after curing.

Next, means for making contact with the integrated circuit is constructed. Typically this involves forming vias, which are openings within the conductive material. The vias are typically then filled with a conductive material and the surface is etched or polished and etched to form plugs. In the preferred embodiment of the present invention this contact is made by etching vias in the polyimide layer as illustrated by block 303. This may be done by conventional mask and etch processes. A conditioning step may also be performed so as to improve the bond between the polyimide layer and the titanium layer. This may be done by an argon sputter etch process.

Next, as shown by block 304 a layer of titanium is deposited so as to fill the vias and cover the surface of the wafer. Thus the plugs and the interposed layer are formed by one titanium deposition step.

A second embodiment of the present invention forms plugs and a planar dielectric surface by performing a polish/etch process on the wafer surface after the deposition of the titanium layer. The wafer surface is polished until only that portion of the titanium layer which constitutes the plugs remains exposed. Then a second layer of titanium is deposited so as to overlie the dielectric layer and the plugs. One advantage of using this second embodiment which requires two titanium deposition steps would be the increased planarization achieved. However, since this involves additional process steps, the preferred embodiment of the present invention forms the plugs and the titanium layer in a single step.

Next, as illustrated by block 305 a layer of aluminum is deposited over the wafer surface. This layer may be deposited by sputter depositing a solution of 99.5% aluminum and 0.5% copper on to the wafer surface. The layer is then masked and etched to form bonding pads and interposed pads as shown by block 306. The etch of the aluminum layer is performed by a wet etch using a mixture of $H_3PO_4$, $HNO_3$ and $CH_3COOH$. After the etch, the photoresist is stripped off and the mixture of $H_2O_2$ and $NH_4OH$ is used to etch the titanium layer. The aluminum layer is used as a mask, therefore, additional deposit and patterning of photoresist is not required. The bonding pads and interposed pads will overlie the plugs so as to form an electrical connection between the integrated circuit device and the bonding pad. Next, as illustrated by block 307 a passivation layer is deposited over the wafer surface. This passivation layer may be formed from polyimide, silicon dioxide, silicon nitride, or silicon oxynitride and is preferably silicon nitride deposited by plasma enhanced chemical vapor deposition. This passivation layer is then masked and etched to expose a portion of each of the bonding pads as shown by block 308.

As shown by block 309, leads are next placed onto the exposed portions of the bonding pads. Bonding of the leads to the bonding pads is then performed as shown by block 310 by applying ultrasonic energy to the leads. Bonding may be achieved by using in the range of 100 to 140 milliwatts of ultrasonic power, and using between 60 to 130 grams of force. In the preferred embodiment of the present invention an ultrasonic energy level of 100 milliwatts is used at a force of 60 grams and a temperature of 200 degrees C. An automated bonding machine such as a K&S 1484 thermosonic Au ball bonder or a K&S 1472 ultrasonic wedge bonder is preferably used.

The stiffness of the aluminum bonding pad and the underlying titanium interposed pad is sufficient so as to allow for effective bonding. This is due to the fact that the stiffness prevents the ultrasonic energy from being dissipated into the polyimide. The integrity of the metallurgical wire formed by this process is thus not compromised due to the fact that polyimide is used as a dielectric layer.

One with skill in the art would realize that any of a number of materials could be used to form both the interposed pad and the bonding pad. For example, gold, nickel, platinum, silver or other metals could be used to form the bonding pad. Similarly other metals having sufficient rigidity (high modulus of elasticity) could be used to form the interposed pad. For example, copper, molybdenum or nickel could be used. Also, additional mask and etch steps could be performed after deposition of the interposed layer so that the interposed layer does not overlie the plugs formed in the dielectric layer. Then the bonding pad layer could directly overlie the plugs so as to make direct electrical contact. In this manner a nonconductive material could be used to form the interposed pad.

What is claimed is:

1. A method of forming a bonding structure on a semiconductor device having a compliant dielectric layer comprising the steps of:

depositing a first layer of conductive material over said compliant dielectric layer, said first layer of conductive material having a modulus of elasticity greater than that of a second layer of conductive material;

depositing said second layer of conductive material so that said second layer of conductive material overlies said first layer of conductive material;

etching said first and second layers of conductive material so as to selectively electrically couple said semiconductor device to said first and second layers of conductive material.

2. The method of forming a bonding structure of claim 1 further comprising the steps of depositing and etching a layer of passivation material so as to selectively expose portions of said second layer of conductive material.

3. The method of forming a bonding structure of claim 2 wherein said first layer of conductive material comprises a material selected from the group consisting of copper and nickel and molybdenum and titanium or any combination thereof.

4. The method of forming a bonding structure of claim 3 wherein said second layer of conductive material comprises a material selected from the group consisting of aluminum and gold and silver or any combination thereof.

5. The method of forming a bonding structure of claim 4 wherein said compliant dielectric layer comprises polyimide.

6. The method of forming a bonding structure of claim 5 wherein said first layer of conductive material has a thickness of approximately 0.5 $\mu$m and said second layer of conductive material has a thickness of 3 $\mu$m.

7. A method of bonding a lead to an integrated circuit device comprising:

forming a first dielectric layer over said integrated circuit device, said first dielectric layer comprising a compliant dielectric material;

forming an interposed pad, said interposed pad selectively overlying said first dielectric layer;

forming a bonding pad, said bonding pad electrically coupled with said integrated circuit device and at least partially overlying said interposed pad;

forming a second dielectric layer, said second dielectric layer having openings selectively formed therein so as to expose portions of said bonding pad;

attaching a lead to said exposed portions of said bonding pad; and securing said lead to said exposed portion of said bonding pad by applying energy to said lead, said interposed pad having a stiffness greater than that of said bonding pad so as to allow for the effective bonding of said lead to said exposed portion of said bonding pad.

8. The method of bonding a lead to an integrated circuit device of claim 7 wherein said compliant dielectric layer comprises polyimide.

9. The method of bonding a lead to an integrated circuit device of claim 5 wherein said interposed pad comprises a material selected from the group consisting of copper and nickel and molybdenum and titanium or any combination thereof.

10. The method of bonding a lead to an integrated circuit device of claim 7 wherein said bonding pad comprises a material selected from the group consisting of aluminum and gold and silver or any combination thereof.

11. The method of bonding a lead to an integrated circuit device of claim 10 wherein said lead is secured to said exposed portion of said bonding pad at a force of between 60 and 130 grams.

12. The method of bonding a lead to an integrated circuit device of claim 11 wherein said lead is secured to said exposed portion of said bonding pad at an ultrasonic power of between 100 milliwatts and 140 milliwatts.

13. The method of bonding a lead to an integrated circuit device of claim 12 wherein said lead comprises gold and wherein thermosonic bonding methods are used to bond said lead to said bonding pad.

14. The method of bonding a lead to an integrated circuit device of claim 13 wherein said thermosonic bonding is conducted by applying ultrasonic energy to said lead at an elevated temperature.

15. The method of bonding a lead to an integrated circuit device of claim 12 wherein said lead comprises silver and wherein ultrasonic bonding methods are used to bond said lead to said bonding pad.

16. The method of bonding a lead to an integrated circuit device of claim 8 wherein said step of forming said first dielectric layer includes the steps of depositing a layer of polyimide over said integrated circuit device; masking, patterning and etching said layer of polyimide so as to form a plurality of vias.

17. The method of bonding a lead to an integrated circuit device of claim 16 wherein said step of forming an interposed pad includes the step of forming a plurality of plugs, said plugs and said interposed pad being formed by the deposition of a layer of titanium over said layer of polyimide, said layer of titanium filling said vias so as to form plugs and an overlying layer of titanium.

18. The method of bonding a lead to an integrated circuit device of claim 16 further comprising the step of forming a plug, said plug allowing for electrical connection to said integrated circuit device within said first dielectric layer.

19. The method of bonding a lead to an integrated circuit device of claim 18 wherein said step of forming an interposed pad comprises the step of depositing a layer of refractory metal having a modulus of elasticity greater than the modulus of elasticity of said bonding pad over said first dielectric layer and over said plug such that said layer of refractory metal is electrically connected to said integrated circuit device.

20. The method of bonding a lead to an integrated circuit device of claim 19 where in the step of forming said bonding pad comprises the steps of:

depositing a layer of aluminum over said layer of refractory metal;

etching said layer of aluminum so as to form a bonding pad; and etching said interposed layer so as to electrically connect said interposed layer to said integrated circuit device and such that said bonding pad is electrically coupled with said integrated circuit device.

21. The method of bonding a lead to an integrated circuit device of claim 7 wherein said step of forming a dielectric layer includes the step of forming a plurality of vias therein, and wherein said step of forming said interposed pad is performed so as to fill said vias.

22. The method of bonding a lead to an integrated circuit device of claim 21 wherein said steps of forming an interposed pad and forming a bonding pad comprise the steps of:

depositing a layer of titanium over said first dielectric layer;

depositing a layer of aluminum over said layer of titanium; and selectively etching said layer of aluminum and said layer of titanium so as to form said bonding pad and said interposed pad.

23. The method of bonding a lead to an integrated circuit device of claim 22 wherein said step of selectively etching said layer of aluminum and said layer of titanium comprises the steps of:

depositing a layer of photoresist over said layer of aluminum;

patterning said layer of photoresist to form an exposed region of said layer of aluminum;

performing a first etch, said first etch etching said exposed region of said layer of aluminum so as to form an exposed region of said layer of titanium;

removing said photoresist remaining after said first etch; and performing a second etch, said second etch selectively etching said exposed region of said layer of titanium.

* * * * *

UNITED STATES PATENT AND TRADEMARK OFFICE
CERTIFICATE OF CORRECTION

| | | |
|---|---|---|
| PATENT NO. | : 6,265,300 B1 | Page 1 of 1 |
| APPLICATION NO. | : 08/154268 | |
| DATED | : July 24, 2001 | |
| INVENTOR(S) | : Bhansali et al. | |

It is certified that error appears in the above-identified patent and that said Letters Patent is hereby corrected as shown below:

On the first drawing sheet, in the legend after "FIG. 1"

insert -- (PRIOR ART) -- .

In column 5, at line 53, delete "device of claim 5" and insert

--device of claim 7-- .

Signed and Sealed this

Second Day of October, 2007

JON W. DUDAS
*Director of the United States Patent and Trademark Office*